(12) United States Patent
Kim et al.

(10) Patent No.: US 6,607,925 B1
(45) Date of Patent: Aug. 19, 2003

(54) HARD MASK REMOVAL PROCESS INCLUDING ISOLATION DIELECTRIC REFILL

(75) Inventors: Unsoon Kim, Santa Clara, CA (US); Dawn M. Hopper, San Jose, CA (US); Yider Wu, Campbell, CA (US); Krishnashree Achuthan, San Ramon, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/165,837

(22) Filed: Jun. 6, 2002

(51) Int. Cl.[7] ............................................... H01L 21/00
(52) U.S. Cl. ............................ 438/4; 438/201; 438/257; 438/435
(58) Field of Search ........................... 438/4, 197, 201, 438/257, 296, 435

(56) References Cited

U.S. PATENT DOCUMENTS 5,968,842 A * 10/1999 Hsiao .......................... 438/692
5,985,677 A * 11/1999 Nishio et al. ................... 438/4

* cited by examiner

Primary Examiner—Carl Whitehead, Jr.
Assistant Examiner—David S Blum
(74) Attorney, Agent, or Firm—Winstead Sechrest & Minick P.C.

(57) ABSTRACT

A method for repairing an isolation dielectric damaged during a semiconductor fabrication process is disclosed in which a hard mask material is used to pattern a first material, the first material having openings therein exposing isolation regions comprising a first isolation dielectric layer. The method includes etching the hard mask material from the first material, wherein the etch creates gouges in the first isolation dielectric layer, and depositing a second layer of isolation dielectric over the first material, wherein the second isolation dielectric layer fills the gouges in the first isolation dielectric layer. The method further includes polishing on the second layer of isolation dielectric to remove the second layer of isolation dielectric from the first material.

12 Claims, 7 Drawing Sheets

HARD MASK REMOVAL PROCESS INCLUDING ISOLATION DIELECTRIC REFILL

FIELD OF THE INVENTION

The present invention relates to semiconductor processing, and more particularly to a method for repairing an isolation dielectric damaged by a hard mask removal process.

BACKGROUND OF THE INVENTION

During the fabrication of flash memory arrays, a layer of polysilicon referred to as Poly 1 is patterned over a silicon substrate in which trenches filled with an isolation dielectric form isolation regions that separate active device regions. Thereafter, floating gates are formed out of the Poly 1 by etching the Poly 1 over the isolation dielectric regions. One goal of the etching process is to etch as little of the Poly 1 away as possible to create spaces as small as possible.

Previous techniques for etching the Poly 1 include depositing a layer photoresist over the layer of Poly 1, and patterning the photoresist using lithographic techniques to form a mask. The photoresist mask is then used to etch the Poly 1 by exposing the uncovered areas of Poly 1 to light. The,Poly 1 is etched to form parallel lines of Poly 1 that will be used to form floating gates. Thereafter, the photoresist mask is removed.

Although this technique is effective for etching the Poly 1, the lines of Poly 1 can be patterned no closer than 0.14 microns due to lithographic limitations. For some semiconductor applications, however, such as dense memory arrays, the spacing between the lines of Poly 1 needs to be approximately 0.08–0.05 microns. Currently, this is not possible using lithography.

An improved mask and etch technique has recently been developed for patterning materials during semiconductor fabrication that is capable of surpassing lithographic limitations. This mask and etch technique substitutes a hard mask for a photoresist mask when patterning a material during semiconductor fabrication that allows the smaller spaces in the material to be formed. After the material has been patterned, the hard mask is removed using either a dry etch or a wet etch. Both etch techniques, however, may damage the resulting semiconductor. During flash memory array fabrication, for example, if the hard mask is removed using a dry etch, the isolation dielectric in the isolation regions are gouged. Using a wet etch may eliminate the gouging problem, but the wet etch process may erode the surface of Poly 1 and form pits.

Accordingly what is needed is an improved hard mask removal process that results in a non-damaged isolation dielectric in the isolation regions. The present invention addresses such a need.

SUMMARY OF THE INVENTION

The present invention provides a method for repairing an isolation dielectric damaged during a semiconductor fabrication process in which a hard mask material is used to pattern a first material, the first material having openings therein exposing isolation regions comprising a first isolation dielectric layer. The method includes etching the hard mask material from the first material, wherein the etch creates gouges in the first isolation dielectric layer, and depositing a second layer of isolation dielectric over the first material, wherein the second isolation dielectric layer fills the gouges in the first isolation dielectric layer. The method further includes polishing on the second layer of isolation dielectric to remove the second layer of isolation dielectric from the first material.

According to the system and method disclosed herein, removing a majority of the hard mask using a wet etch, rather than removing all of the hard mask, prevents the wet etch from damaging the first material. And using a dry etch to remove the remainder of the hard mask substantially eliminates gouging.

DETAILED DESCRIPTION

The present invention relates to a method for repairing gouges in an isolation dielectric caused by a hard mask removal process. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a method for repairing gouges in an isolation dielectric caused by a hard mask removal process during semiconductor fabrication. In a preferred embodiment of the present invention, the hard mask removal and repair process is used during the fabrication of flash memory arrays in which Poly 1 is patterned on a silicon substrate using a nitride hard mask that must be removed after the Poly 1 has been patterned into floating gates.

Figure 1:
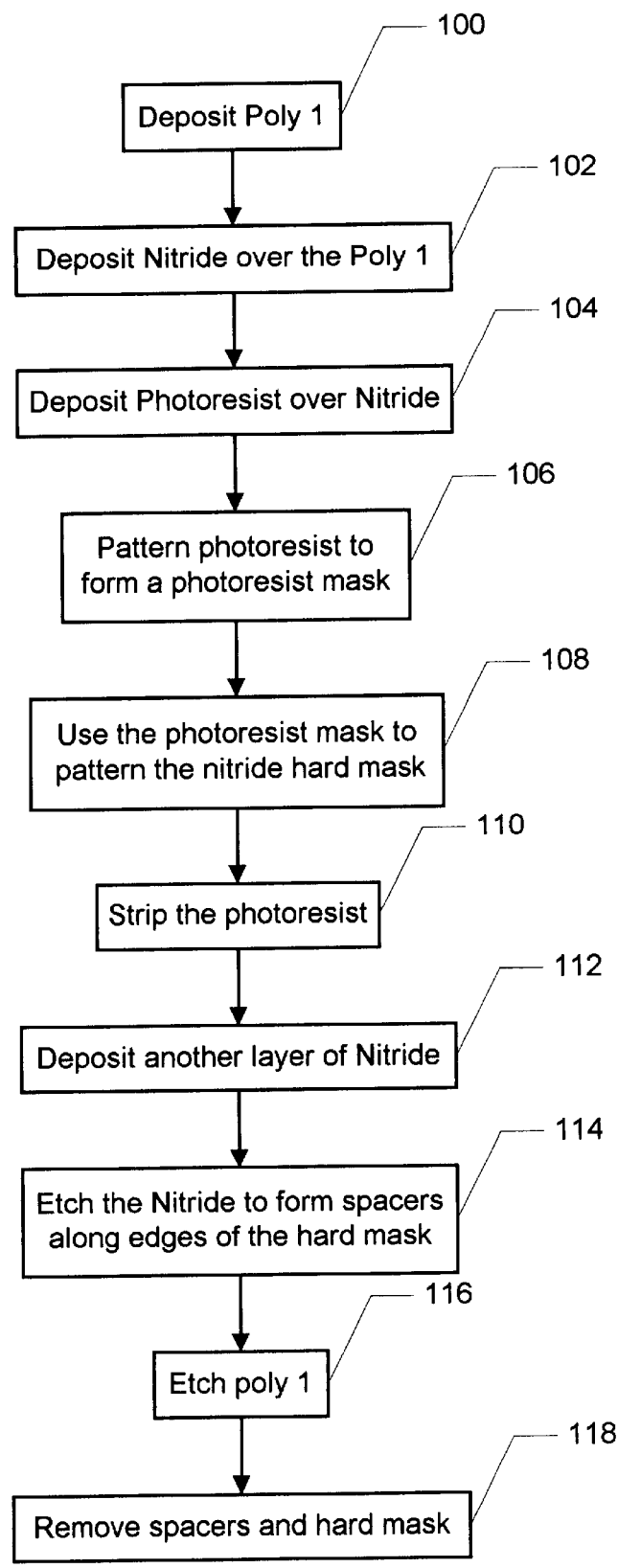
FIG. 1 is a flow chart illustrating fabrication steps used to pattern Poly 1 into floating gates using a hard mask.
Figure 2A:
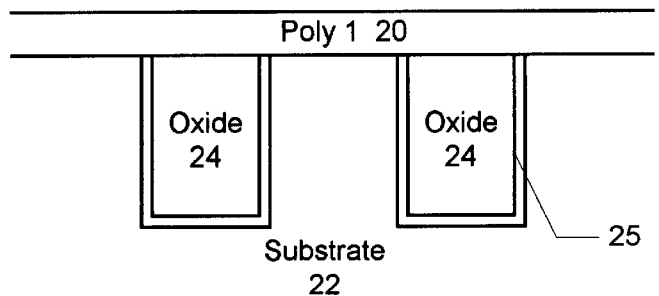
FIGS. 2A–2I are cross-sectional views of the silicon substrate during the fabrication steps described in FIG. 1.

FIG. 1 is a flow chart illustrating the fabrication steps used to pattern Poly 1 into floating gates using a hard mask. FIGS. 2A–2I are cross-sectional views of the silicon substrate during the fabrication steps described in FIG. 1. The process begins by depositing a layer of Poly 1 20 over a tunnel oxide 25 and silicon substrate 22 in step 100. As shown in FIG. 2A, the substrate 22 includes insulating regions of the tunnel oxide 25 and isolation dielectric 24, such as such as TEOS (tetraethyl orthosilicate) or HDP (high-density plasma). The isolation regions are formed in-between active areas where transistors will be located. The tunnel oxide 25 and the isolation dielectric 24 are deposited by conventional methods, and will therefore not be discussed in detail.

Figure 2B:
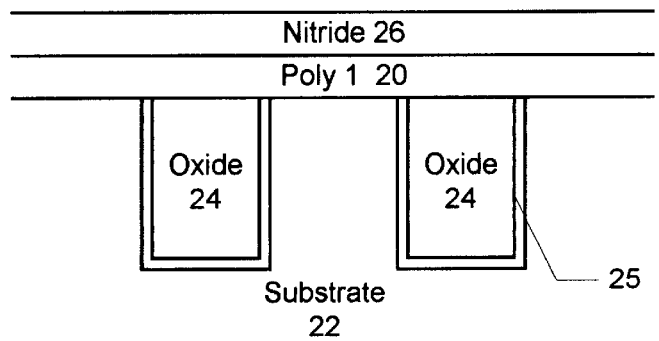

After the Poly 1 has been deposited, a layer of nitride 26, or other such material, is deposited over the Poly 1 20 in step 102 to eventually form a hard mask (FIG. 2B). In a preferred embodiment, the nitride layer 26 is approximately 150–1500 angstroms thick. After the nitride 26 is deposited, a layer of photoresist 28 is deposited over the nitride 26 in step 104

Figure 2C:
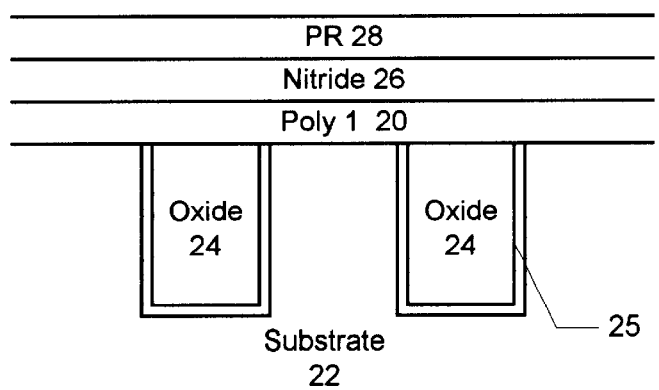
Figure 2D:
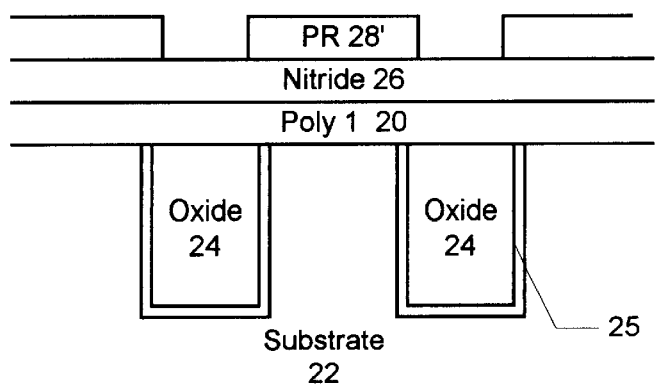
Figure 2E:
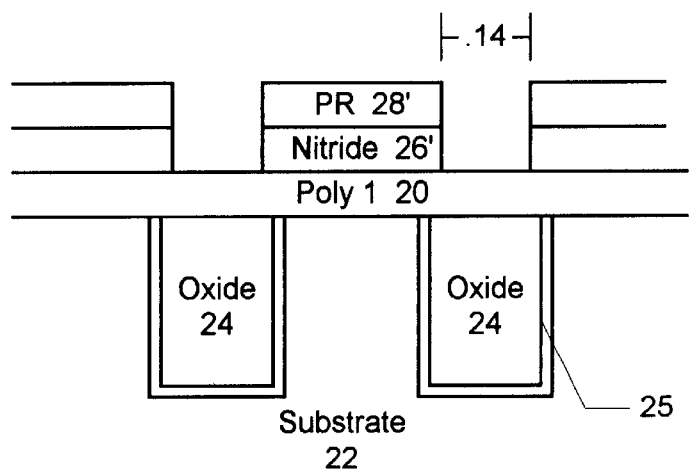
Figure 2F:
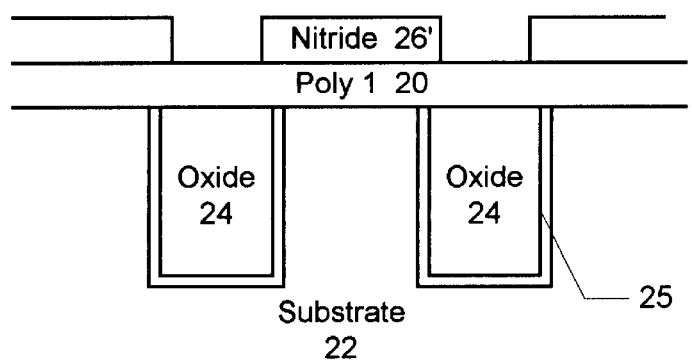

(FIG. 2C). The photoresist 28 is then patterned in step 106 to form a photoresist mask 28' (FIG. 2D). The photoresist mask 28' is then used to pattern the nitride hard mask 26' in step 108 (FIG. 2E). After the nitride hard mask 26' has been patterned, the photoresist 28 is stripped in 110 (FIG. 2F). What remains is a nitride hard mask 26' having gaps that are no smaller than 0.14 microns due to the limits of lithography.

Figure 2G:
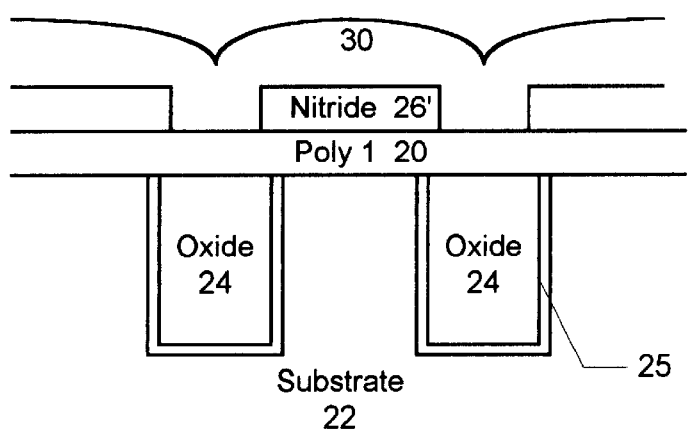
Figure 2H:
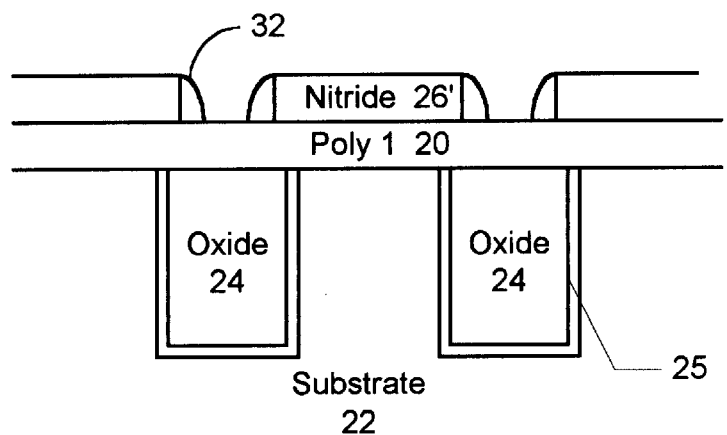
Figure 2I:
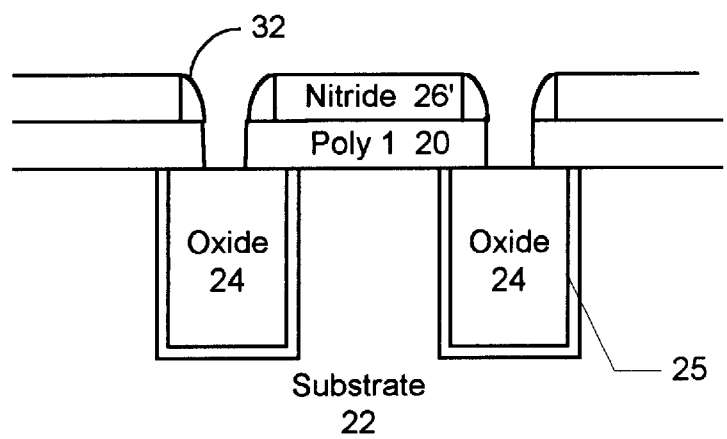

In order to create smaller gaps in the nitride hard mask 26'0 that exceed the limits of lithography, another layer of nitride 30 (or other such material) is patterned over the nitride hard mask 26' in step 112 (FIG. 2G). This layer of nitride 30 is then etched to form spacers 32 along the nitride edges in step 114 (FIG. 2H). After the spacers 32 are formed, the Poly 1 20 is etched using the spacers 32 and nitride 26 as a mask in step 116 to form lines of Poly 1 20 (FIG. 2I). In a preferred embodiment, the spaces between the lines of Poly 1 20 are 0.08–0.05 microns, which exceed lithography limits.

Figure 3:
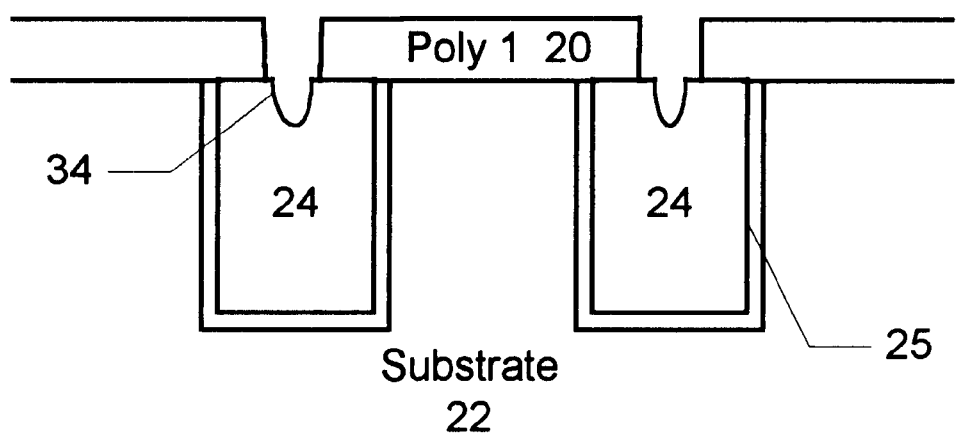
FIG. 3 is a cross-sectional view of the substrate showing the results of a conventional dry etch.

After the Poly 1 20 has been etched, the spacers 32 and nitride mask 28' need to be removed in step 118. Conventional methods for removing the spacers 32 and hard mask 26' include utilizing either a dry etch, or a wet etch. FIG. 3 is a cross-sectional view of the substrate 22 showing that if the spacers 32 and hard mask 26' are removed using a dry etch, then gouges 34 are typically formed in the isolation dielectric 24.

According to the present invention, the gouges 34 in the isolation dielectric 24 are repaired after dry etch stip of the hard mask.

Figure 4:
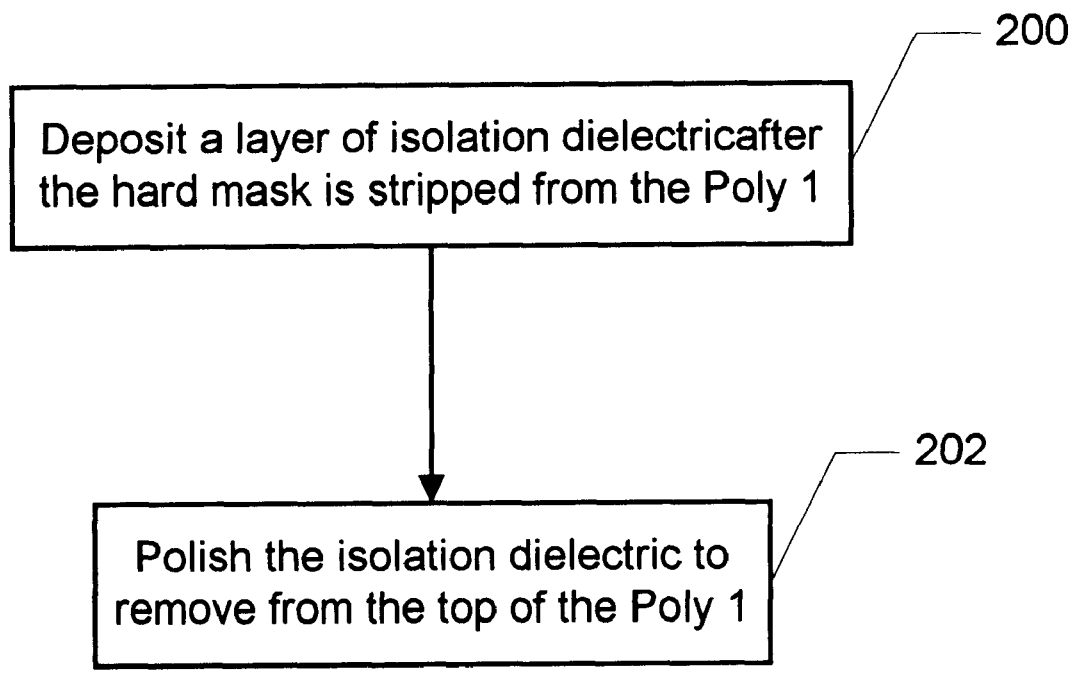
FIG. 4 is a flow chart illustrating the process of repairing the gouges in the isolation dielectric.
Figure 5A:
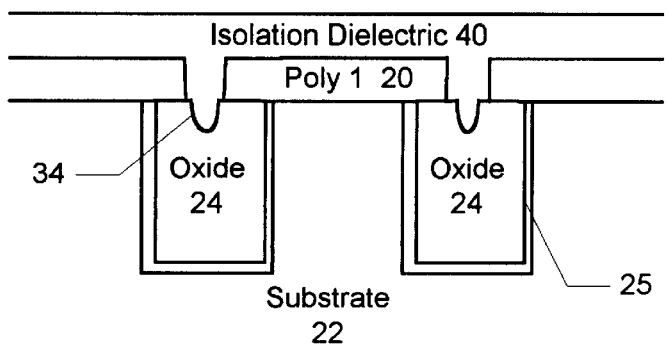
FIGS. 5A–5B are cross-sectional views of the substrate during the gouge refill process of the present invention.

FIG. 4 is a flow chart illustrating the process of repairing the gouges 34 in the isolation dielectric 24 in accordance with a preferred embodiment of the present invention. After the hard mask 28' is stripped from the Poly 1 20, a layer of isolation dielectric 40, such as TEOS or HDP, is deposited over the substrate in step 200. FIG. 5A is a cross-sectional view of the substrate showing the isolation dielectric 40. In a preferred embodiment, the same type of isolation dielectric 40 used to originally fill the trenches is deposited over the substrate after the hard mask removal. Also a preferred embodiment, the layer of isolation dielectric 40 may be approximately 500 to 2000 angstroms in thickness.

Figure 5B:
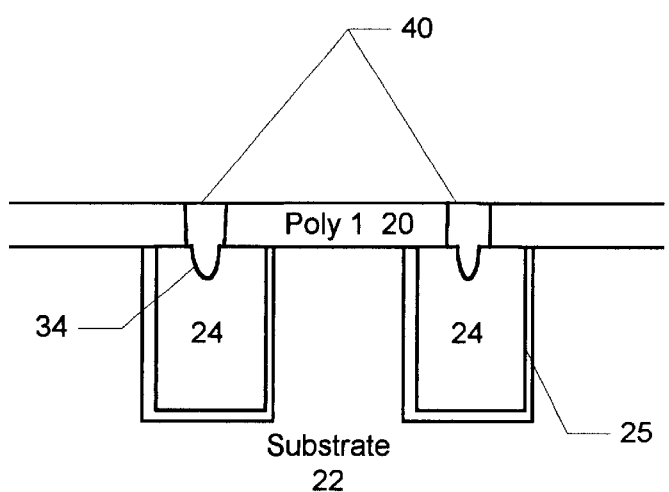

After the deposition, the isolation dielectric 40 is polished back in step 202, preferably using chemical mechanical polished (CMP), until its top surface is level with the. Poly 1 20. FIG. 5B is a cross-sectional view of the substrate after the dielectric 40 polish. As shown, the polishing process removes the isolation dielectric 40 from the top surface of the Poly 1 20, while the remaining portion of the isolation dielectric 40 effectively refills the gouges 34 formed in the original isolation dielectric 24.

Although the present invention has been described in terms of the preferred embodiment, those of ordinary skill in the art will readily recognize that dielectric gouge repair process may apply to any semiconductor process where a hard mask material is removed from another material and damages the isolation dielectric.

The present invention has been described in accordance with the shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for repairing an isolation dielectric damaged during a semiconductor fabrication process in which a hard mask material is used to pattern a first material, the first material having openings therein exposing isolation regions comprising a first isolation dielectric layer, the method comprising the steps of:

(a) etching the hard mask material from the first material, wherein the etch creates gouges in the first isolation dielectric layer;

(b) depositing a second layer of isolation dielectric over the first material, wherein the second isolation dielectric layer fills the gouges in the first isolation dielectric layer; and (c) performing a polish on the second layer of isolation dielectric to remove the second layer of isolation dielectric from the first material.

2. The method of claim 1 wherein step (b) further includes the step of providing the second isolation dielectric layer as a same type as the first isolation dielectric layer.

3. The method of claim 2 wherein step (b) further includes the step of providing HDP as the second isolation dielectric layer.

4. The method of claim 3 wherein step (b) further includes the step of providing as the second isolation dielectric layer.

5. The method of claim 3 further including step of performing the hard mask removal during fabrication of a flash memory array in which the hard mask has been patterned on top of a layer of polysilicon that is deposited over a silicon substrate that has trenches filled with the first isolation dielectric layer.

6. The method of claim 5 further including step of providing nitride as the hard mask.

7. A method of removing a hard mask during a semiconductor process, the method comprising the steps of:

(a) depositing a layer of polysilicon over a substrate that includes insulating regions filled with a first isolating dielectric layer;

(b) patterning a hard mask over the layer of polysilicon;

(c) forming spacers along the edges of the hard mask;

(d) using the spacers and the hard mask to pattern the polysilicon; and (e) removing the spacers and hard mask, wherein the removal creates gouges in the first isolation dielectric layer;

(f) depositing a second layer of isolation dielectric over the first material, wherein the second isolation dielectric layer fills the gouges in the first isolation dielectric layer; and (g) polishing the second layer of isolation dielectric to remove the second layer of isolation dielectric from the first material.

8. The method of claim 7 wherein step (f) further includes the step of providing the second isolation dielectric layer as a same type as the first isolation dielectric layer.

9. The method of claim 8 wherein step (f) further includes the step of providing HDP as the second isolation dielectric layer.

10. The method of claim 8 wherein step (f) further includes the step of providing TEOS as the second isolation dielectric layer.

11. The method of claim 8 further comprising the steps of using nitride as the hard mask.

12. The method of claim 11 further comprising the steps of patterning the polysilicon such that the polysilicon includes gaps of approximately 0.08–0.05 microns.

* * * * *

UNITED STATES PATENT AND TRADEMARK OFFICE
CERTIFICATE OF CORRECTION

PATENT NO. : 6,607,925 B1
DATED : August 19, 2003
INVENTOR(S) : Unsoon Kim et al.

It is certified that error appears in the above-identified patent and that said Letters Patent is hereby corrected as shown below:

Column 3,
Line 9, please replace "26'0" with -- 26' --.
Line 44, following "the" please delete ".".
Line 58, following "with the" please insert -- embodiments --.

Column 4,
Line 22, following "providing" please insert -- TEOS --.

Signed and Sealed this

Twentieth Day of January, 2004

JON W. DUDAS
*Acting Director of the United States Patent and Trademark Office*